United States Patent
Miyazaki et al.

(10) Patent No.: US 7,324,397 B2
(45) Date of Patent: Jan. 29, 2008

(54) SEMICONDUCTOR INTEGRATED CIRCUIT

(75) Inventors: Shinya Miyazaki, Maebaru (JP); Kei Katoh, Tokyo (JP); Koudoh Yamauchi, Fukuoka (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/541,605

(22) Filed: Oct. 3, 2006

(65) Prior Publication Data
US 2007/0086229 A1    Apr. 19, 2007

Related U.S. Application Data

(63) Continuation of application No. 10/505,216, filed on Aug. 20, 2004, now Pat. No. 7,116,571.

(51) Int. Cl.
G11C 7/02    (2006.01)
(52) U.S. Cl. .................. 365/210; 365/94; 365/207
(58) Field of Classification Search ........... 365/207, 365/94, 210
See application file for complete search history.

(56) References Cited

U.S. PATENT DOCUMENTS

| | | | |
|---|---|---|---|
| 4,775,958 A | 10/1988 | Hashimoto | 365/185.2 |
| 4,788,663 A | 11/1988 | Tanaka et al. | 365/185.1 |
| 5,237,534 A | 8/1993 | Tanaka et al. | 365/185.21 |
| 5,726,929 A | 3/1998 | Suminaga et al. | |
| 6,034,884 A * | 3/2000 | Jung | 365/145 |
| 6,166,938 A * | 12/2000 | Wong | 365/49 |
| 6,252,793 B1 * | 6/2001 | Allen et al. | 365/145 |
| 6,252,813 B1 | 6/2001 | Liu | |
| 6,288,941 B1 | 9/2001 | Seki et al. | 365/185.12 |
| 6,310,809 B1 | 10/2001 | Roohparvar et al. | |

FOREIGN PATENT DOCUMENTS

| | | |
|---|---|---|
| EP | 506989 A1 | 4/1991 |
| EP | 0 506 989 A1 | 10/1992 |
| EP | 0 810 606 A1 | 12/1997 |

(Continued)

OTHER PUBLICATIONS

Office Action and copy of English Translation of Office Action dated May 8, 2007.

Primary Examiner—Thong Q. Le
(74) Attorney, Agent, or Firm—Antonelli, Terry, Stout & Kraus, LLP.

(57) ABSTRACT

A semiconductor integrated circuit has a nonvolatile memory and a logic circuit which uses information stored in the nonvolatile memory to perform logical operation. The nonvolatile memory comprises bit lines, word lines, and memory cells. The memory cell comprises MOS transistors whose gate electrodes are connected with a word line. Information storage is carried out according to whether one source/drain electrode of the MOS transistors is connected with a source line or floated. During other periods than a predetermined period in the operation of accessing the memory cell, the potential difference between the source/drain electrodes of the MOS transistors constituting the memory cell is zeroed. Subthreshold leakage current is prevented from passing through the memory cell on standby. During the predetermined period in accessing operation, a potential difference is produced between the source/drain electrodes of the MOS transistors. Therefore, the bit line potential can be varied by word line

10 Claims, 8 Drawing Sheets

FOREIGN PATENT DOCUMENTS

| | | |
|---|---|---|
| JP | 62-249478 | 10/1987 |
| JP | 1-100797 | 4/1989 |
| JP | 2-14495 | 1/1990 |
| JP | 5-190807 | 7/1993 |
| JP | 06-089591 | 3/1994 |
| JP | 07-078489 | 3/1995 |
| JP | 7-78489 | 3/1995 |
| JP | 9-106691 | 4/1997 |
| JP | 09-259594 | 10/1997 |
| JP | 10-64292 | 3/1998 |
| JP | 10-209304 | 8/1998 |
| JP | 10-320993 | 12/1998 |
| JP | 11-16384 | 1/1999 |
| JP | 2000-12707 | 1/2000 |
| JP | 2000-276891 | 10/2000 |

* cited by examiner

SEMICONDUCTOR INTEGRATED CIRCUIT

This application is a Continuation application of prior application Ser. No. 10/505,216, filed Aug. 20, 2004, now U.S. Pat. No. 7,116,571 the contents of which are incorporated herein by reference in their entirety.

BACKGROUND OF THE INVENTION

The present invention relates to a semiconductor integrated circuit of the type having a nonvolatile memory. More particularly, it relates to a technique which leads to an improvement in the enhancement of the speed and a reduction of the power consumption of a nonvolatile memory of the type that is effectively applied to a microcomputer, a system LSI, and the like.

Japanese Unexamined Patent Publication No. Hei 1(1989)-100797, Japanese Unexamined Patent Publication No. Hei 2(1990)-14495, and Japanese Unexamined Patent Publication No. Hei 10(1998)-320993 disclose ROMs (Read Only Memories). These ROMs are so constituted that memory cells having a two-transistor configuration are provided between bit lines, and a complementary output is "read out" to complementary bit lines.

Japanese Unexamined Patent Publication No. Hei 10(1998)-64292 discloses a ROM wherein, in the initial state (standby state), bit line pairs are brought to the level of the ground voltage of the circuit. Japanese Unexamined Patent Publication No. Hei 11(1999)-16384 discloses a masked ROM wherein the source electrode of memory cell transistors is connected to the ground voltage of the circuit, and pulldown circuits are provided for the bit lines of the memory cell transistors.

Japanese Unexamined Patent Publication No. Hei 7(1995)-78489 discloses a masked ROM wherein contacts (ROM's eyes) with memory cell transistors are formed between them and a source line.

Japanese Unexamined Patent Publication No. 2000-012707 discloses a ROM wherein the density of storage cells is enhanced. This enhancement is implemented by forming the ROM of MOS semiconductor devices, which receive the source potential of storage cells (the ground voltage of the circuit) in the (field oxide film) regions between the drains of the storage cells to isolate data between the storage cells.

The present inventors have considered the performance of semiconductor integrated circuits, such as a microcomputer or a system LSI, provided with a ROM and a logic circuit, such as a CPU, and the like, which utilize information stored in the ROM. As a result, the present inventors have found that the following is useful in enhancing the operating performance of the semiconductor integrated circuits: an access rate suitable for the operating speed of a CPU is attained in a ROM, and the power consumption of the ROM is reduced so that the major part of power available to the entire semiconductor integrated circuit can be allocated to the logic circuit. With the enhancement of the speed and packing density of logic circuits, the operating voltage tends to be lowered. In conjunction with this, on-chip ROMs are required to operate on as low a voltage as the logic circuit from the viewpoint of cost and the like. With a lowered operating power supply, an increase in useless power consumption due to a subthreshold leakage current becomes an issue. In addition, it can be difficult to discriminate between a subthreshold leakage current which passes through a lot of unselected memory cells and a current which passes through memory cells selected during memory access. As a result, the reliability of a memory operation and, further, that of a data processing operation utilizing it, will be lost.

An object of the present invention is to provide a semiconductor integrated circuit wherein, even if the voltage of the operating power supply to an on-chip nonvolatile memory is lowered, a stabilization, acceleration, and a power consumption reduction can be accomplished with respect to a read operation on the nonvolatile memory.

Another object of the present invention is to provide a semiconductor integrated circuit wherein, even if the voltage of the operating power supply to an on-chip nonvolatile memory, as well as an on-chip logic circuit, is lowered, an access rate suitable for the operating speed of the logic circuit can be attained in a ROM, and wherein the power consumption of the ROM can be reduced so that the major part of power available to the entire semiconductor integrated circuit can be allocated to the logic circuit.

These and other objects and novel features of the present invention will be apparent from the following description and the accompanying drawings.

SUMMARY OF THE INVENTION

[1]<<Subthreshold Leakage Current Reduction>>

The semiconductor integrated circuit according to the present invention has, over one semiconductor substrate, a nonvolatile memory and a logic circuit which utilizes information stored in the nonvolatile memory to perform a logical operation. The nonvolatile memory comprises bit lines, word lines, and memory cells. A memory cell comprises a MOS transistor whose gate electrode is connected with a word line. Then, information storage is carried out according to whether one source/drain electrode of the MOS transistor is connected with a current path or in a floating state. The semiconductor integrated circuit comprises a control circuit which operates as follows: during a predetermined period in the operation of accessing a memory cell, the control circuit produces a potential difference between the source/drain electrodes of the MOS transistor. During the other periods than the predetermined period, the control circuit reduces the potential difference between the source/drain electrodes of the MOS transistor to zero. As mentioned above, during the other periods than the predetermined period in the operation of accessing a memory cell, the potential difference between the source/drain electrodes of the MOS transistor constituting the memory cell is zero. At this time, therefore, subthreshold leakage current does not pass through the memory cell. During the predetermined period in the accessing operation, a potential difference is produced between the source/drain electrodes of the MOS transistor, and the bit line potential can be varied by word line selection. As a result, power uselessly consumed at the memory array on standby can be reduced, and this contributes to reduction in the power consumption of the semiconductor integrated circuit.

In this specification, the term MOS transistor is defined as the generic name for insulated gate field-effect transistors. With respect to this type of transistor, the source electrode and drain electrode are relative conceptions, and they are determined by the level of voltage applied to them. When they are collectively referred to, they are each described as "source/drain electrode."

One of the preferred embodiments is constituted as follows: the time at which a potential difference is produced between the source/drain electrodes of the MOS transistor is matched with or delayed behind the time at which word line selection is carried out. When a potential difference is produced between the source/drain electrodes of the MOS transistor, a subthreshold current gets ready to pass through the MOS transistor in every memory cell. As mentioned above, however, the time at which the potential difference is produced is matched with or delayed behind the time at which word line selection is carried out. Thus, the difference between the subthreshold leakage current that passes through due to the production of a potential difference and the current that passes through a selected memory cell is relatively increased. As a result, the possibility that it is difficult to discriminate between a subthreshold leakage current and an information current can be eliminated. The subthreshold leakage current passes through a large number of memory cells that are unselected for access, and the information current passes through the memory cells that are selected for access. This ensures the memory operation of the nonvolatile memory in the semiconductor integrated circuit and, further, the reliability of the data processing operation of the logic circuit which utilizes it.

The nonvolatile memory and the logic circuit use, for example, a common supply voltage as their operating power supply voltage. When the voltage of the operating power supply is lowered with the speedup of the logic circuits and the miniaturization of the devices, on-chip nonvolatile memories are also required to operate on the same low-voltage power supply as the logic circuits do. In consideration of this, the foregoing brings the following advantages: useless power consumption due to a subthreshold leakage current which is made obvious in the nonvolatile memory by a low-voltage power supply is reduced. Therefore, the major part of the power available to the entire semiconductor integrated circuit can be allocated to the logic circuit. From the viewpoint of the amount of power which can be consumed at the logic circuit, the processing power of the logic circuit can be enhanced. Thus, the semiconductor integrated circuit according to the present invention is effectively applicable to, for example, a data processing system which uses battery power.

<<Uniformization of Bit Line Load>>

Another preferred embodiment of the present invention may adopt the following structure in addition to the above-described means: whether a MOS transistor is connected with the current path or floated is determined according to whether one source/drain electrode on the opposite side to a bit line is connected with a predetermined signal line. Thus, the MOS transistor in any memory cell is connected with a bit line. This helps uniformize the load from a bit line (bit line load) among the bit lines. This is useful in the stabilization and acceleration of a read operation.

<<Dummy MOS Separation Structure>>

A further preferred embodiment of the present invention may adopt the following structure in addition to the above-described means: MOS transistors respectively contained in a plurality of memory cells disposed along the bit lines are formed in a common well. Then, the common drains and the like between the MOS transistors are electrically separated by dummy MOS transistors whose gate electrode is supplied with an off potential. If, in order to electrically separate the MOS transistors of memory cells, a structure to separate a semiconductor region, such as a diffusion layer, is adopted, an isolation region must be ensured between the memory cells. This results in an accordingly increased chip occupation area. Further, if the isolation region is disposed for every one of the multiple information storage MOS transistors, the pitch of word lines is not matched with the arrangement of a plurality of the information storage MOS transistors. Where the minimum wiring pitch is set to a value smaller than the wavelength of light, phase shift techniques are utilized in mask pattern generation. In this case, providing patterns with regularity helps uniformize the pattern form. In consideration of this, if the pitch of layout of the gate electrodes of information storage MOS transistors is irregular, it is difficult to uniformize their pattern form. As a result, the miniaturization of devices, that is, the miniaturization of patterns is hindered. According to the above-described means, the gate electrodes of MOS transistors for information storage and the gate electrodes of dummy MOS transistors can be regularly laid out. Therefore, the above-described means helps uniformize their pattern form.

<<Complementary Bit Line Structure>>

A further preferred embodiment of the present invention may adopt the following memory cell structure in addition to the above-described means: two MOS transistors are prepared for each memory cell, and the other source/drain electrodes of the two MOS transistors are connected with separate bit lines which constitute complementary bit lines. At the same time, their gate electrodes are connected with a common word line. Adoption of a complementary bit line structure for the readout system brings the following advantage: even if the signal amplitude is reduced as a result of low-voltage operation, readout of stored information and judgment of their logical values can be stabilized and accelerated by differential amplification or the like. For differential amplification, for example, an amplifier which amplifies the potential difference between the complementary bit lines can be used.

[2]<<Complementary Bit Line Structure and Uniformization of Bit Line Load>>

The semiconductor integrated circuit according to the present invention, based on the viewpoint of complementary bit line structure and the uniformization of bit line load, is constituted as follows: the semiconductor integrated circuit has, over one semiconductor substrate, a nonvolatile memory and a logic circuit which utilizes information stored in the nonvolatile memory to perform a logical operation. The nonvolatile memory comprises memory cells, word lines, complementary bit lines, and differential amplifiers connected with the complementary bit lines. The memory cell comprises a pair of MOS transistors whose gate electrodes are connected with the same word line. The one source/drain electrodes of the MOS transistors are separately connected with corresponding bit lines of the complementary bit lines. The other source/drain electrode of one MOS transistor is connected with a voltage signal line that is supplied with a predetermined voltage, and the other source/drain electrode of the other MOS transistor is floated.

The nonvolatile memory and the logic circuit may use a common supply voltage as their operating power supply voltage.

[3]<<Complementary Bit Line Structure and Subthreshold Leakage Reduction>>

The semiconductor integrated circuit according to the present invention, based on the viewpoint of complementary bit line structure and subthreshold leakage reduction, is constituted as follows: the semiconductor integrated circuit has over one semiconductor substrate a nonvolatile memory and a logic circuit which utilizes information stored in the nonvolatile memory to perform a logical operation. The nonvolatile memory comprises memory cells, word lines, complementary bit lines, and differential amplifiers connected with the complementary bit lines. The memory cell comprises a pair of MOS transistors whose gate electrodes are connected with the same word line. The source/drain electrodes of one MOS transistor are connected with a bit line and a voltage signal line supplied with a predetermined voltage. The source/drain electrodes of the other MOS transistor are in a floating state with respect to a bit line or the voltage signal line. During a predetermined period in the operation of accessing the memory cell, a voltage is applied to the voltage signal line, which voltage produces a potential difference between it and the bit line. During the other periods than the predetermined period, a voltage is applied which reduces the potential difference between the voltage signal line and the bit line to zero.

As a preferred embodiment of the present invention, the nonvolatile memory and the logic circuit may use a common supply voltage as their operating power supply voltage.

A further embodiment of the present invention may be constituted as follows: during the other periods than the predetermined period in an accessing operation, the voltage signal lines and the complementary bit lines are brought to the supply voltage level. During the predetermined period, the voltage signal lines are discharged to the ground voltage of the circuit. The opposite constitution may be adopted. That is, during the other periods than the predetermined period, the voltage signal lines and the complementary bit lines may be discharged; and, during the predetermined period, the bit lines may be charged to the supply voltage level. In this case, however, a relatively long time is required to charge the bit lines to the level at which operation becomes possible.

In a further preferred embodiment of the present invention, the following constitution is preferable: the time at which the voltage signal is discharged to the ground voltage of the circuit during the predetermined period should be matched with or delayed behind the time at which a memory cell is selected through a word line.

[4]<<Complementary Bit Line Structure and Dummy MOS Separation Structure>>

The semiconductor integrated circuit according to the present invention, based on the viewpoint of complementary bit line structure and dummy MOS separation structure, is constituted as follows: the semiconductor integrated circuit has over one semiconductor substrate a nonvolatile memory and a logic circuit, which utilizes information stored in the nonvolatile memory to perform a logical operation. The nonvolatile memory and the logic circuit use a common supply voltage as their operating power supply voltage. The nonvolatile memory comprises memory cells, word lines, complementary bit lines, and differential amplifiers connected with the complementary bit lines. The memory cell comprises a pair of MOS transistors whose gate electrodes are connected with the same word line. The source/drain electrodes of one MOS transistor are connected with a bit line and a voltage signal line supplied with a predetermined voltage. The source/drain electrodes of the other MOS transistor are in a floating state with respect to a bit line or the voltage signal line. The MOS transistors respectively contained in a plurality of memory cells disposed along the bit lines are formed in a common well. Then, these MOS transistors are electrically separated by dummy MOS transistors whose gate electrodes are supplied with an off potential.

[5]<<Uniformization of Bit Line Load and Dummy MOS Separation Structure>>

The semiconductor integrated circuit according to the present invention, based on the viewpoint of the uniformization of bit line load and dummy MOS separation structure, is constituted as follows: the semiconductor integrated circuit has, over one semiconductor substrate, a nonvolatile memory and a logic circuit which utilizes information stored in the nonvolatile memory to perform a logical operation. The nonvolatile memory and the logic circuit use a common supply voltage as their operating power supply voltage. The nonvolatile memory comprises bit lines, word lines, and memory cells. The memory cell comprises a MOS transistor whose gate electrode is connected with a word line. Information storage is carried out according to whether one source/drain electrode of the MOS transistor is connected with a current path or is in a floating state. Whether the MOS transistor is connected with the current path or in a floating state is determined according to whether one source/drain electrode on the opposite side to a bit line is connected with a predetermined signal line. The MOS transistors respectively contained in a plurality of memory cells disposed along the bit lines are formed in a common well. Then, the MOS transistors are electrically separated by dummy MOS transistors whose gate electrodes are supplied with the off potential.

[6]<<Complementary Bit Line Structure and Uniformization of Bit Line Load>>

The semiconductor integrated circuit according to a further preferred embodiment of the present invention, based on the viewpoint of complementary bit line structure and the uniformization of bit line load, is constituted as follows: the semiconductor integrated circuit comprises a nonvolatile memory. The nonvolatile memory comprises complementary bit lines, word lines, memory cells connected with the complementary bit lines and the word lines, and differential amplifiers connected with the complementary bit lines. The memory cell comprises a first MOS transistor and a second MOS transistor. The first MOS transistor has one source/drain electrode connected with one bit line of the complementary bit lines and a gate electrode connected with the word line. The second MOS transistor has one source/drain electrode connected with the other bit line of the complementary bit lines and a gate electrode connected with the word line. The other source/drain electrode of the first MOS transistor is connected with a voltage signal line supplied with a predetermined voltage. The other source/drain electrode of the second MOS transistor is in a floating state.

[7]<<Complementary Bit Line Structure and Subthreshold Leakage Reduction>>

The semiconductor integrated circuit according to a further preferred embodiment of the present invention, based on the viewpoint of complementary bit line structure and subthreshold leakage reduction, is constituted as follows: the semiconductor integrated circuit comprises a nonvolatile memory. The nonvolatile memory comprises complementary bit lines, word lines, memory cells connected with the complementary bit lines and the word lines, and differential amplifiers connected with the complementary bit lines. The memory cell comprises a first MOS transistor and a second MOS transistor. The first MOS transistor has one source/drain electrode connected with one bit line of the complementary bit lines and a gate electrode connected with the word line. The second MOS transistor has one source/drain electrode connected with the other bit line of the complementary bit lines and a gate electrode connected with the word line. The other source/drain electrode of the first MOS transistor is connected with a voltage signal line supplied with a predetermined voltage. A voltage is applied to the voltage signal line which voltage zeroes the potential difference between the voltage signal line and the one source/drain electrode during the other periods than the predetermined period in the operation of accessing the memory cell.

[8]<<Complementary Bit Line Structure and Dummy MOS Separation Structure>>

The semiconductor integrated circuit according to a further preferred embodiment of the present invention, based on the viewpoint of complementary bit line structure and dummy MOS separation structure, is constituted as follows: the semiconductor integrated circuit comprises a nonvolatile memory. The nonvolatile memory comprises complementary bit lines, word lines, memory cells connected with the complementary bit lines and the word lines, and differential amplifiers connected with the complementary bit lines. The memory cell comprises a first MOS transistor and a second MOS transistor. The first MOS transistor has one source/drain electrode connected with one bit line of the complementary bit lines and a gate electrode connected with the word line. The second MOS transistor has one source/drain electrode connected with the other bit line of the complementary bit lines and a gate electrode connected with the word line. In each memory cell, the other source/drain electrode of any one of the first MOS transistor and the second MOS transistor is connected with a voltage signal line supplied with a predetermined voltage. A third transistor is formed between the other source/drain electrodes of first MOS transistors which adjoin each other and share a bit line between them. The third transistor is controlled into the off state. The third transistor constitutes the dummy MOS transistor.

BEST MODE FOR CARRYING OUT THE INVENTION

Figure 2:
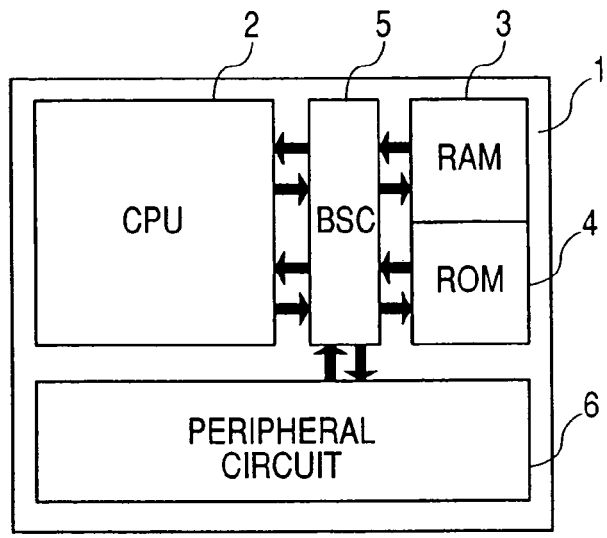
FIG. 2 is a block diagram illustrating a semiconductor integrated circuit according to the present invention.

FIG. 2 illustrates a semiconductor integrated circuit according to the present invention. The semiconductor integrated circuit 1 illustrated in the figure is constituted as a microcomputer or system LSI. The semiconductor integrated circuit 1 is obtained by forming the following over one semiconductor chip by, for example, a publicly known CMOS integrated circuit fabrication technique: a central processing unit (CPU) 2, RAM 3, ROM 4, a bus controller (BSC) 5, and a peripheral circuit 6. However, its constitution is not limited to this. The CPU 2 performs computation and control processing by fetching instructions and decoding the fetched instructions. The RAM 3 is used as a work area or area for temporarily storing data when the CPU 2 performs computation and control processing. The ROM 4 holds operating programs for the CPU 2 and parameter data, and information stored in the ROM 4 is used by the CPU 2, the peripheral circuit 6, or the like. The peripheral circuit 6 includes an A-D converter, a D-A converter, a timer/counter, an input/output port circuit, accelerators, typified by digital signal processor (DSP) and ECC circuit, for the CPU 2, other custom logic circuits, and the like. The bus controller 5 carries out control of external bus access required for data fetch and instruction fetch by the CPU 2, and the like operations.

The operating power supply of the semiconductor integrated circuit is common to the CPU 2, RAM 3, ROM 4, and BCS 5, and it has an operating power supply voltage of, for example, 1.2V. The peripheral circuit may also be operated on the same operating power supply. If a circuit module, such as a flash memory, requiring high voltage for a specific operation is included, the circuit module can be supplied with high-voltage operating power. The high-voltage operating power supply is obtained externally or by internally multiplying a voltage. Both the CPU 2 and the ROM 4 operate on the same low-voltage power supply. When the CPU 2 is operated at high speed in synchronization with a clock signal, the ROM 4 can be operated at high speed appropriate to the high speed, as will be described later. Further, though the signal amplitude of stored information read out of the memory cells is small because of the low-voltage power supply, the read operation is stabilized, and the power consumption is reduced. Thus, the ROM 4 has such a constitution as to contribute to the enhancement of the data processing power of the CPU 2. The ROM 4 will be described in detail below.

Figure 3:
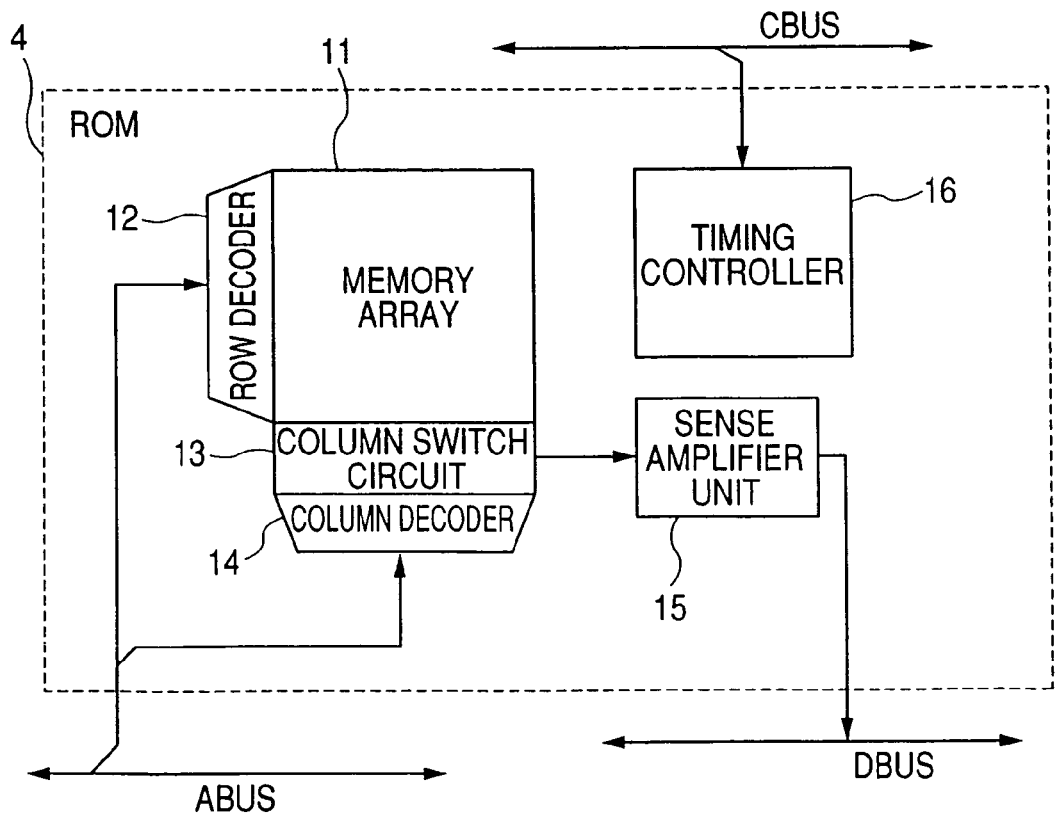
FIG. 3 is a block diagram illustrating the overall constitution of a ROM.

FIG. 3 is a block diagram of the ROM 4. The ROM 4 comprises a memory array 11, a row decoder 12, a column switch circuit 13, a column decoder 14, a sense amplifier unit 15, and a timing controller 16. The memory array 11 comprises a plurality of memory cells disposed in a matrix pattern and the like. The selection terminals of the memory cells are connected with word lines, and the data terminals of the memory cells are connected with bit lines. The row decoder 12 decodes row address signals supplied through an address bus ABUS, and it generates word line selection signals. The column decoder 14 decodes column address signals supplied through the address bus ABUS, and it generates column selection signals. The column switch circuit 13 is fed with column selection signals, and it selects complementary bit lines specified by the column address signals. Information stored in a memory cell selected by a word line selection signal is transmitted to a complementary global bit line through a complementary bit line selected by a column selection signal. The sense amplifier unit 15 amplifies read information transmitted to the complementary global bit line, and it outputs it to a data bus DBUS. The timing controller 16 is fed with memory enable signals, read signals, write signals, and the like that are supplied through a control bus CBUS, and it generates internal access timing signals. The internal access timing signals include activation timing signals for the decoders 12 and 14 and the sense amplifier unit 15. The address bus ABUS, data bus DBUS, and control bus CBUS are constituted as internal buses connected to the CPU 2 or the like.

Figure 1:
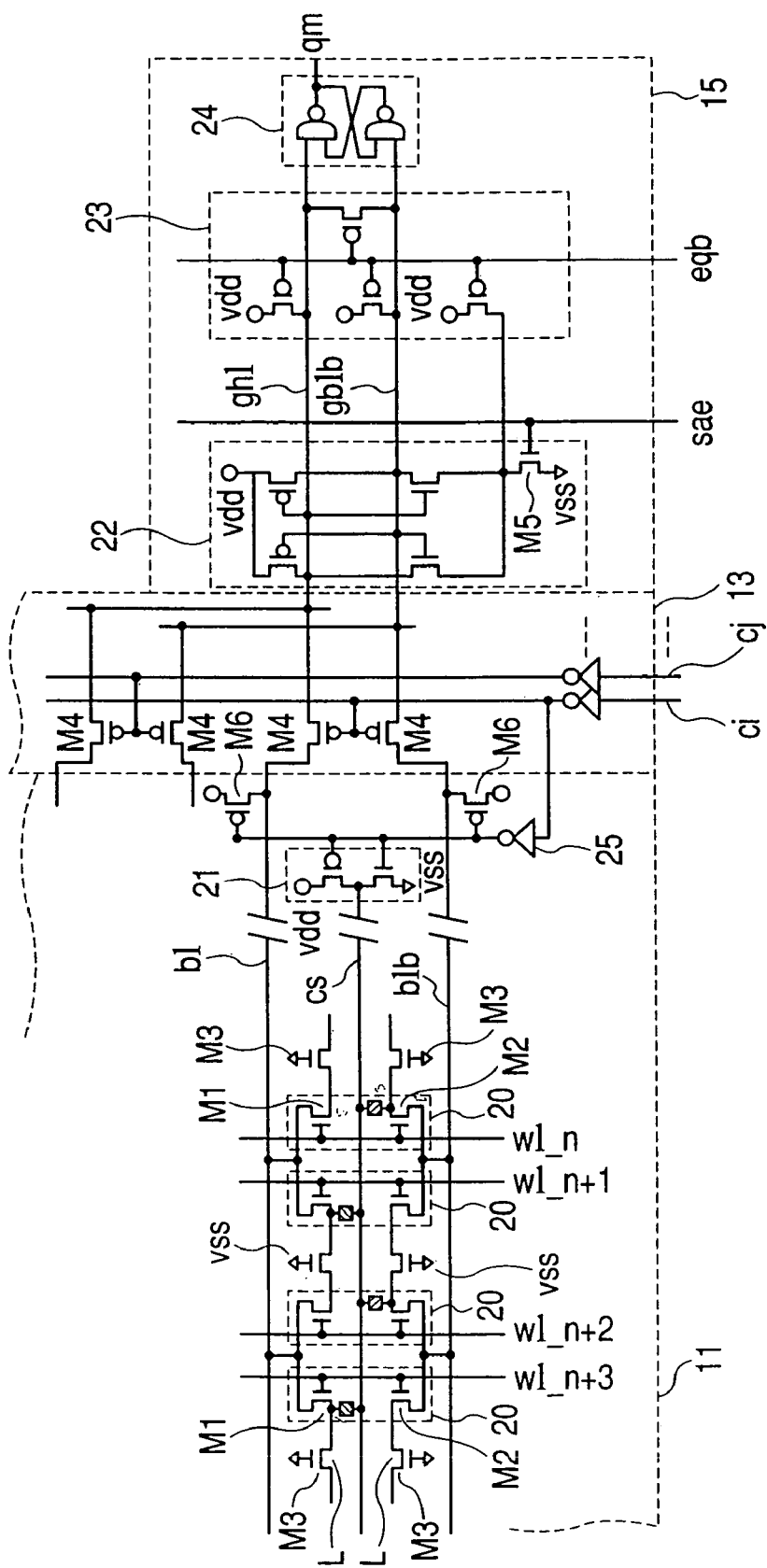
FIG. 1 is a schematic circuit diagram illustrating a representative part of a ROM in a semiconductor integrated circuit according to the present invention.

FIG. 1 illustrates a representative part of the ROM 4. The memory array 11 has a plurality of sets of complementary bit lines bl and blb in the lateral direction, and it has a plurality of word lines wl_n to wl_n+3 in the longitudinal direction. Each memory cell 20 comprises a first MOS transistor M1 and a second MOS transistor M2, whose gate electrodes are connected with a corresponding word line in common. The drain electrodes of both the MOS transistors M1 and M2 are joined with the complementary bit lines bl and blb. The source electrode of either MOS transistor M1 or M2 is connected with a common source line cs, and the source electrode of the other MOS transistor is floated. The logical value of stored information is determined according to which source electrode is connected with the common source line cs. As mentioned above, information storage is carried out according to the presence or absence of connection to the common source line cs on the opposite side to the bit lines bl and blb. With this constitution, the MOS transistors M1 and M2 in any memory cell are connected with the bit lines bl and blb. This helps uniformize the load as viewed from bit line (bit line load) among the bit lines. This is useful in the stabilization and acceleration of a read operation.

In FIG. 1, the lines L to which the source/drains of the MOS transistors M1 and M2 are connected represent impurity regions, such as diffusion regions, in which the MOS transistors M1 and M2 are formed. How the diffusion layers L are connected with the complementary bit lines bl and blb through contacts is shown in the style of a circuit diagram. The reason why this style of representation has been adopted is as follows: how isolation MOS transistors (also, simply described as "dummy MOS transistors") M3 are formed in the diffusion layers L is to be represented in the style of the circuit diagram. The isolation MOS transistors M3 are dummy MOS transistors which separate MOS transistors adjoining in the lateral direction from each other. The details will be described later.

The common source line cs can be selectively precharged and discharged through a CMOS inverter driver 21. The complementary bit lines bl and blb can be selectively precharged through precharge MOS transistors M6.

The ultimate level of precharge is the supply voltage of the circuit, and the ultimate level of discharge is the ground voltage Vss of the circuit. The control of precharge and discharge is carried out by a corresponding column selection signal ci. In a column unselected state (ci=LOW level), the precharge MOS transistors M6 and the CMOS inverter driver 21 perform a precharge operation. Control is carried out so as to zero the potential difference between the bit lines bl and blb and the common source line cs, and while this is done, a subthreshold leakage current is prevented from passing through the MOS transistors M1 and M2 in a large number of memory cells 20. In the column selected state (ci=HIGH level), the precharge MOS transistors M6 are cut off, and the CMOS inverter driver 21 performs a discharge operation. A potential difference is produced between the bit lines bl and blb and the common source line cs. Thus, the bit line bl or blb can be discharged according to the state of information storage in memory cells 20 (which MOS transistor M1 or M2 is connected with the common source line cs).

The state of potential of the bit lines bl and blb is transmitted to the complementary global bit lines gbl and gblb through MOS transistors M4 which constitute the column switch circuit 13. The global bit lines gbl and gblb are connected with a differential sense amplifier 22, a precharge and equalize circuit 23, and an output latch circuit 24. The differential sense amplifier 22 comprises a CMOS static latch circuit to which operating power can be supplied through a power switch MOS transistor M5. A signal sae is an activation control signal for the differential sense amplifier 22. The differential sense amplifier 22 differentially amplifies complementary signals supplied from the complementary bit lines bl and blb to the complementary global bit lines gbl and gblb. Since read signals from memory cells 20 are differentially amplified, a stable and fast read operation is implemented even if the signal amplitude is small. The precharge and equalize circuit 23 precharges the global bit lines gbl and gblb and the common source electrodes of the n-channel MOS transistors constituting the differential sense amplifier 22 before start of a read operation. This precharge is carried out to a level desired for the operation of the differential sense amplifier 22. (In this case, the desired level is supply voltage vdd.) A signal epb is the operation control signal for the precharge and equalize circuit 23. The output latch circuit 24 comprises a static latch using, for example, a two-input NAND gate, and it holds the output of the differential sense amplifier 23.

Figure 4:
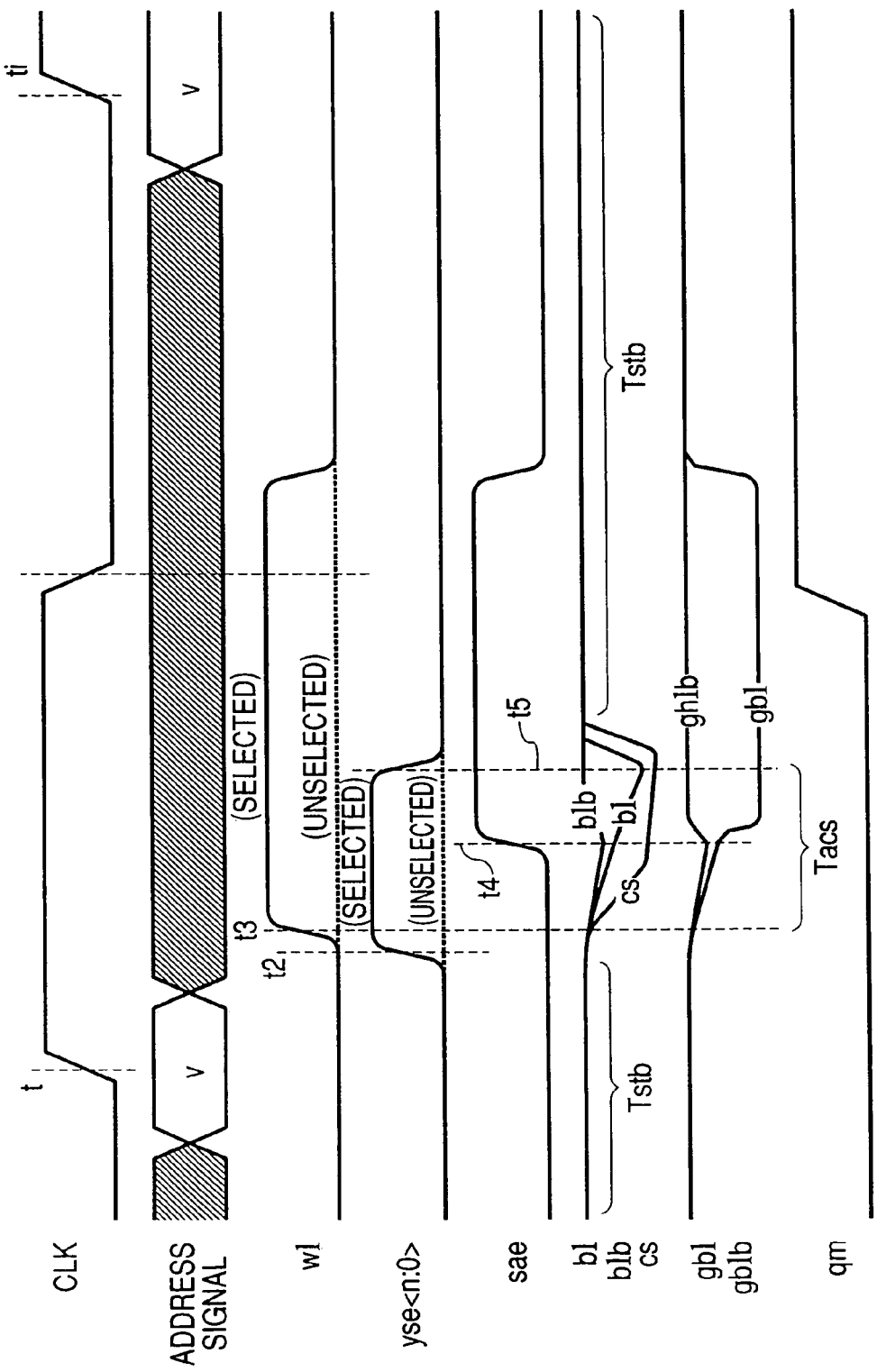
FIG. 4 is a timing chart illustrating the timing of a read operation of a ROM.

FIG. 4 illustrates an example of the timing of a read operation of the ROM 4. The clock signal CLK defines the cycle of access to the ROM 4. The clock signal CLK is a high-speed clock having a frequency equal to or equivalent to a fraction of that of a clock signal serving as the reference for the operation of the CPU 2. Here, wl generically refers to word lines, and yes<n:0>generically refers to column selection signals, such as ci and cj. The access cycle is defined by one period of the clock signal CLK, and the period from time t to time ti is taken as one period. At the beginning of the access cycle, the address signal is made valid (V). At time t2, the column select operation is started, and at time t3, the word line select operation is started. The complementary bit lines bl and blb and the common source line cs are precharged to the supply voltage Vdd until the timing of word line selection comes or until the moment immediately after that. During this period, a subthreshold leakage current dies not pass through the MOS transistor M1 or M2 in the memory cells. The precharge operation on the complementary bit lines bl and blb is stopped in synchronization with time t2, and discharge of the common source line cs is started at time t3 behind time t2, or later. According to the constitution shown in FIG. 1, the delay time from the stopping of the bit line precharge operation to the starting of the common source line cs discharge operation is obtained by delaying the operation by the inverter 25. However, the constitution of the delay time is not limited to this.

As a result of the bit line precharge operation being stopped and the common source line cs being discharged, the following operation takes place: any one of the complementary bit lines bl and blb is discharged according to the state of information storage in the memory cell selected by word line, that is, according to which MOS transistor M1 or M2 is connected with the common source line cs. The differential sense amplifier 22 which is activated at time t4 detects this change, and it complementarily drives the complementary global bit lines gbl and gblb. The complementary signals which occur on the complementary global bit lines gbl and gblb are latched to the output latch circuit 24, and readout data qm is determined.

The column select operation ends at time t5, after the amplifying operation by the differential sense amplifier 22 is established. In synchronization with this, the complementary bit lines bl and blb and the common source line cs are precharged to the supply voltage Vdd again. Thus, a subthreshold leakage current is prevented from passing through the MOS transistors M1 and M2 constituting the memory cells. In the example illustrated in FIG. 4, the period from the time (t3) at which a word line is selected to the time (t5) at which column selection ends is taken as the predetermined period Tacs in the accessing operation. During this period, precharging of the complementary bit lines bl and blb is stopped and the common source line cs is discharged. During the other periods Tstb than the predetermined period, a subthreshold leakage current does not pass through the MOS transistor M1 or M2 constituting the memory cells. Thus, the subthreshold leakage current in the memory array portion, which makes up the majority of the standby current, can be significantly reduced.

The advantage of common source control wherein the common source line cs is discharged only during the predetermined period Tacs involves not only the above-mentioned reduction of the standby current. An additional advantage is also attained in a low-voltage operation: with respect to low-voltage operation specifications and device performance in a micro process, the threshold voltage (Vth) is low, and thus the off leakage current (subthreshold leakage current) is large. For this reason, the influence of the off leakage current due to unselected memory cells, though not completely negligible, can be reduced when data is read out of the ROM. This is done by matching or delaying the time at which the common source line cs is discharged in common source control with or behind the time at which a word line is selected. This will be described with reference to FIG. 5 to FIG. 8.

Figure 5:
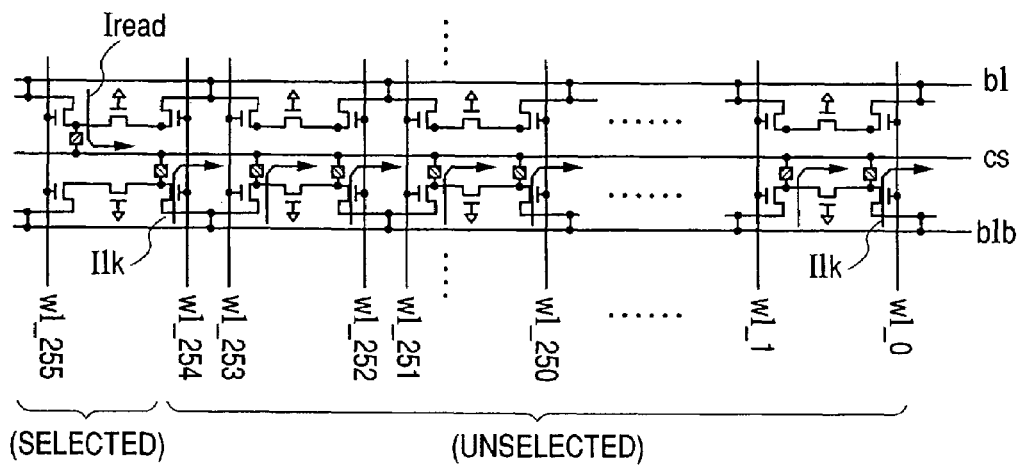
FIG. 5 is a schematic circuit diagram illustrating the relation between memory cell data read current (Iread) and leakage current (Ilk).

FIG. 5 illustrates the relation between memory cell data read current (Iread) and leakage current (Ilk). Read current Iread flows from one bit line (bl) to the common source line cs through the memory cell of a selected word line (wl_255). Leakage current Ilk flows from the other bit line (blb) to the common source line through the memory cells of unselected word lines (wl_0 to wl_254).

Taking as an example a case where memory cells are constituted of MOS transistors of low threshold voltage, the influence of the off leakage current Ilk due to unselected memory cells on the read current Iread will be described. A MOS transistor of low threshold voltage is defined as a MOS transistor whose threshold voltage becomes a negative voltage such as −130 mV when the drain-source current becomes 10 nA or below. When memory cells are constituted of such MOS transistors of low threshold voltage, the influence of the off leakage current due to unselected memory cells, though not completely negligible, can be reduced during a read operation. This is done by setting the timing of word line and common source line cs selection so that the transistors M1 and M2 in a selected memory cell will be in a state of Vgs≧0 and the transistors M1 and M2 in unselected memory cells will be in a state of Vgs≦0 in a read operation.

Figure 6:
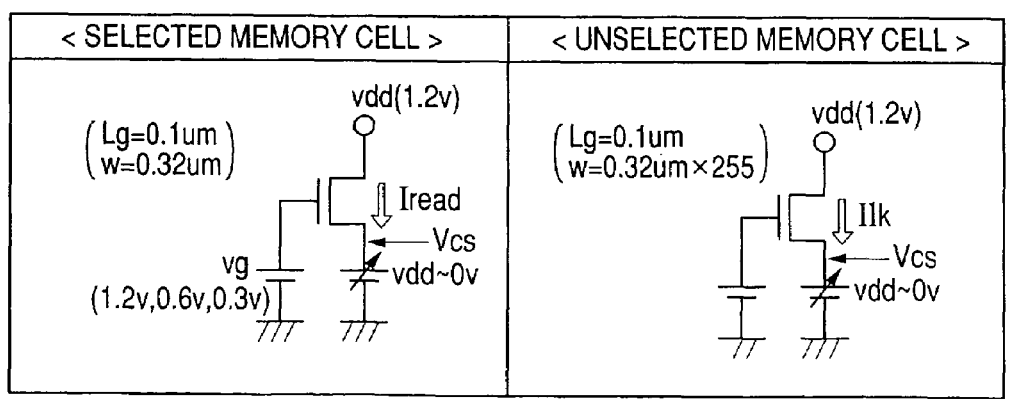
FIG. 6 is a diagram illustrating equivalent circuits for a memory cell selected in a read operation and an unselected memory cell.

FIG. 6 illustrates examples of equivalent circuits for a memory cell selected when data is read out and for an unselected memory cell. The voltage vg is applied to a selected memory cell by word line selection, and the gate potential of the unselected memory cells (255 memory cells) is brought to 0V. In these examples, the supply voltage vdd is set to 1.2V. The selected MOS transistor is so constituted that the gate length is 0.1 μm; the gate width is 0.32 μm; and the threshold voltage is −130 mV. The unselected MOS transistor is so constituted that the gate length is 0.1 μm; the gate width is 0.32×255 μm; and the threshold voltage is −130 mV.

Figure 7:
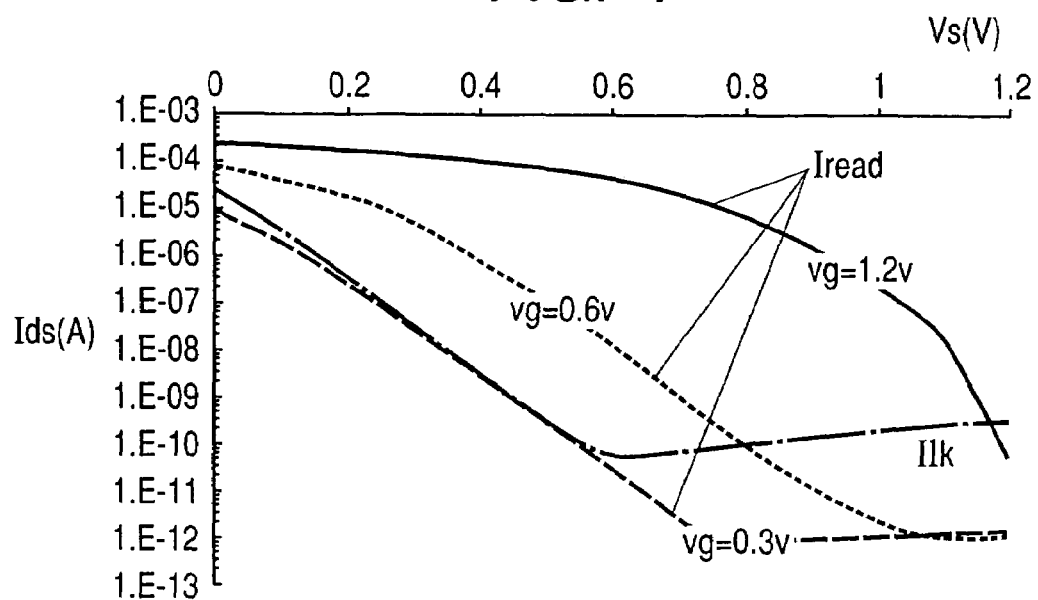
FIG. 7 is a characteristic diagram illustrating the relation between Vcs node voltage and current in the characteristics of read current Iread and off leakage current Ilk.

FIG. 7 illustrates the Vcs node voltage (Vds)-to-current (Ids) characteristic in the characteristics of read current Iread and off leakage current Ilk. The voltage Vs is the source voltage of the transistor. The bit line amplitude in a read operation is in proportion to "Iread-Ilk." Therefore, the larger the difference between read current Iread and off leakage current Ilk is, the greater the margin of operation is. From FIG. 7, the following is evident: when vg=1.2v, the margin of operation is maximized. When vg=0.3v, Ilk is larger than Iread, and, in this state, the bit line amplitude is not obtained, and a read operation is not feasible. More briefly, raising the word line potential, before a state in which off leakage current flows is established, increases the bit line amplitude more.

Figure 8:
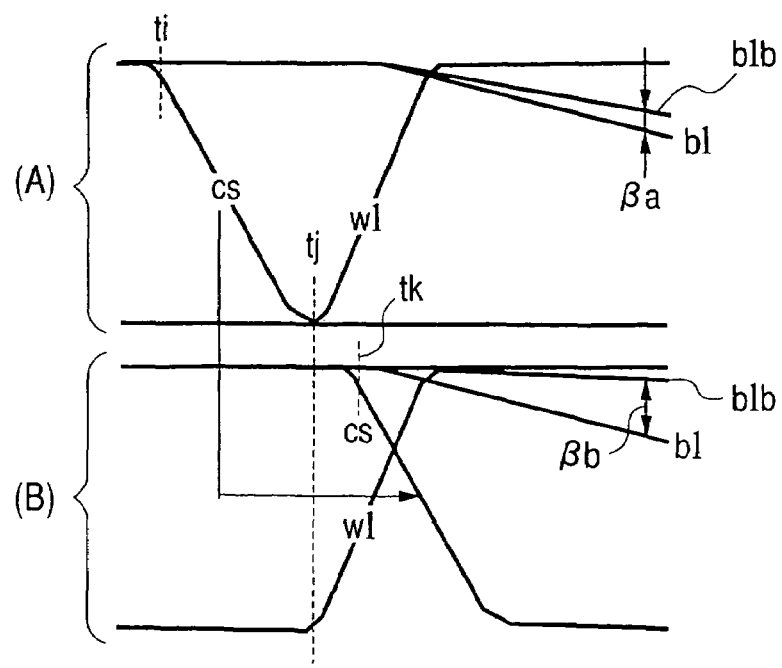
FIG. 8 is a timing chart illustrating the timing of word line selection versus the timing of common source line discharge.

FIG. 8 illustrates an example of the timing of discharging the common source line cs relative to the timing of word line selection with the result in FIG. 7 taken into account. (A) illustrates a case where the time (ti) at which the common source line cs is discharged is earlier than the time (tj) at which a word line is selected. Conversely, (B) illustrates a case where the time (tk) at which the common source line cs is discharged is behind the time (tj) at which a word line is selected. The potential difference between bit lines is greater and varies faster in (B) than in (A) (βa<βb). The following advantage is brought about by delaying the timing (tk) of discharging the common source line cs, as illustrated in (B): even when MOS transistors of low threshold voltage are used, the influence of the off leakage current due to unselected memory cells is reduced, and, thus, a stable read operation can be performed.

Figure 9:
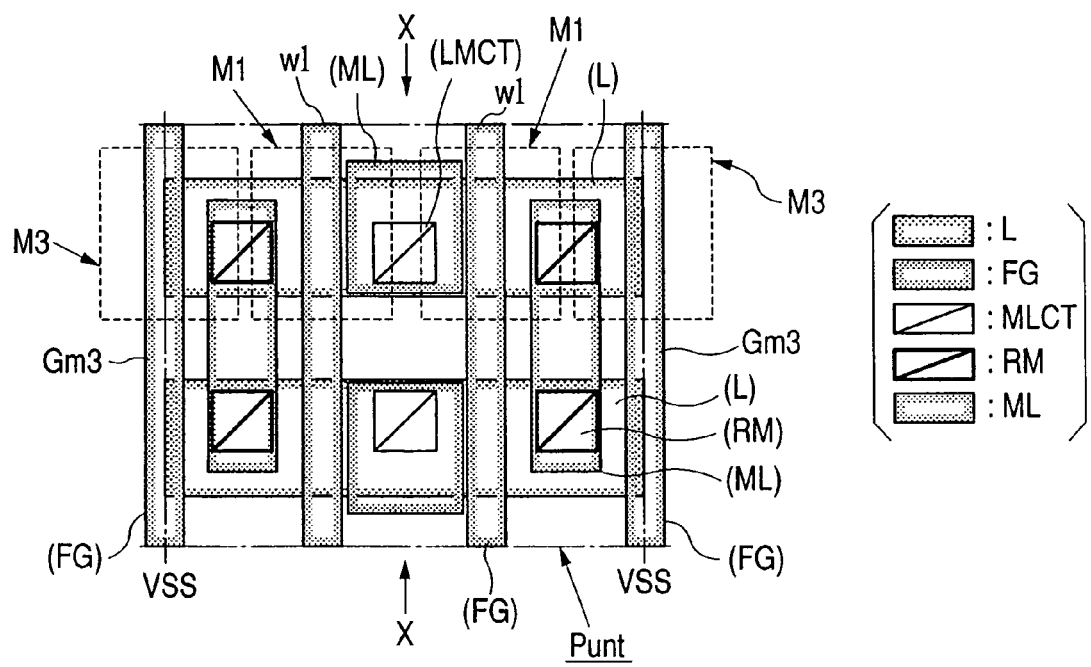
FIG. 9 is a planar layout diagram of memory cells with the focus on a polysilicon wiring layer.
Figure 10:
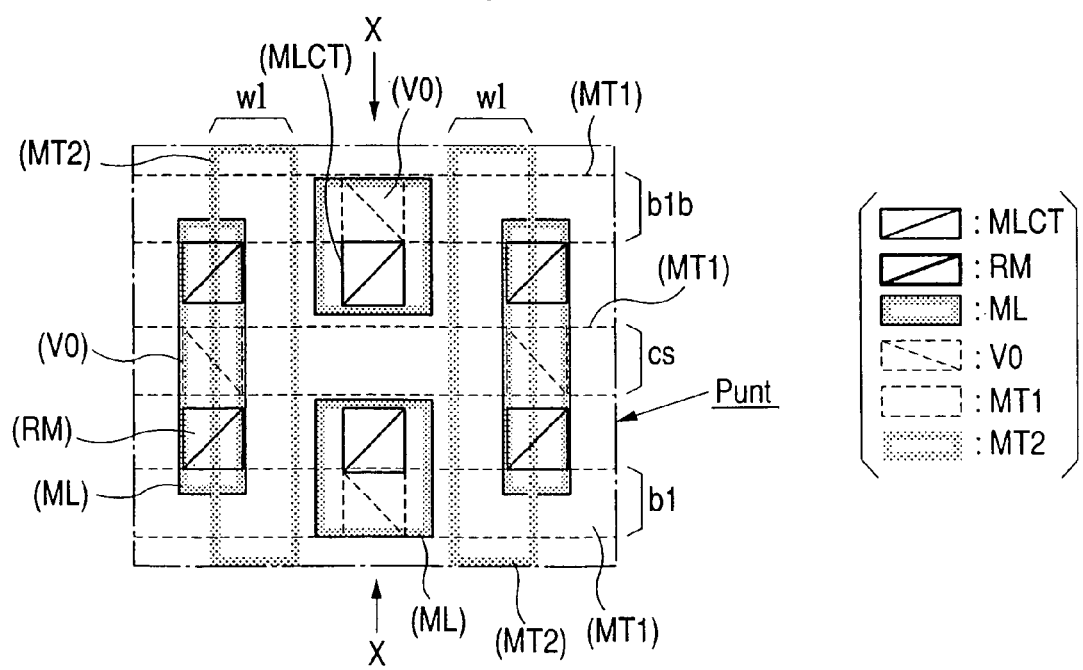
FIG. 10 is a planar layout diagram of the memory cells with the focus on a metal wiring layer.
Figure 11:
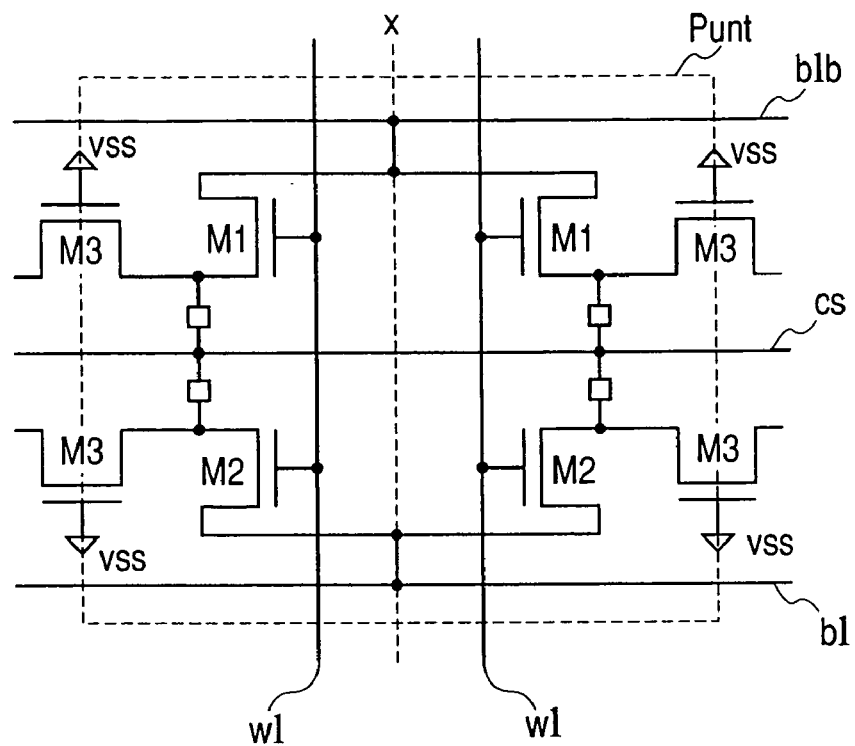
FIG. 11 is a schematic circuit diagram illustrating the circuit connection of the memory cells corresponding to the planer layout in FIG. 9 and FIG. 10.

FIG. 9 and FIG. 10 illustrate examples of the planar layouts of memory cells. FIG. 9 illustrates a layout with the focus on word lines comprising polysilicon wiring. FIG. 10 illustrates a layout with the focus on complementary bit lines and a common source line comprising metal wiring. FIG. 11 illustrates the circuit connection of memory cells corresponding to the planar layouts in FIG. 9 and FIG. 10. The layout patterns in FIG. 9 and FIG. 10 are each symmetrical with respect to the line X-X. The areas encircled with alternate long and short dash lines are taken as a unit area Punt, and this area Punt is repeatedly disposed by the dozen to form a memory array. The areas encircled with the alternate long and short dash lines in FIG. 9 and FIG. 10 correspond to the area encircled with an alternate long and short dash line in FIG. 11.

In FIG. 9, code L denotes a diffusion region serving as an impurity region where the source-drain channels of MOS transistors are formed; FG denotes polysilicon wiring which constitutes the gate electrodes of the MOS transistors; ML denotes a tungsten layer, which is the lowermost metal wiring layer; MLCT denotes a contact for connecting the tungsten layer ML with the diffusion layer L; and RM denotes a contact for connecting the diffusion layer L with the tungsten layer ML to form a so-called ROM's eye. The figure shows four RMs, but actually they are formed only when the sources of the MOS transistors M1 and M2 are connected to the common source line cs. In FIG. 9, Gm3 denotes a polysilicon gate electrode which constitutes an isolation MOS transistor M3.

In FIG. 10, ML denotes a tungsten layer which is the lower most metal wiring layer; MLCT denotes a contact for connecting the tungsten layer ML with the diffusion layer L; and RM denotes a contact for connecting the diffusion layer L with the tungsten layer ML to form a so-called ROM's eye. MT1 denotes a first aluminum wiring layer (or Cu wiring layer); MT2 denotes a second aluminum wiring layer (or Cu wiring layer); and V0 denotes a contact for connecting the tungsten layer ML with the wiring layer M1. The contact V0 is used to connect the drains of the MOS transistors M1 and M2 to a bit line bib and their sources to the common source line cs. The word lines are formed by connecting the second aluminum wiring layer (or the second Cu wiring layer) MT2 to polysilicon gates FG, but the details of the contact portions are omitted from the drawings.

The MOS transistors M1 and M2 which constitute memory cells are disposed by the dozen along the bit lines, and they are formed in a common well. If MOS transistors M1 and M1 (MOS transistors M2 and M2) directly adjoin each other in unit areas Pun of memory cells at this time, the diffusion layer must be cut at that point to electrically separate them from each other. The structure described with reference to FIG. 9 makes it unnecessary to cut the diffusion layer as mentioned above. That is, the following structure is adopted: the MOS transistors M1 and M1 and the MOS transistors M2 and M2 are respectively electrically separated from each other by the dummy MOS transistor M3 whose gate electrode Gm3 is supplied with the off potential (Vss). If a structure is adopted in which a semiconductor region, such as a diffusion layer, is separated to separate MOS transistors in memory cells from each other, an isolation region must be provided between the memory cells. This results in an increased chip occupation area. Further, if the isolation region is disposed for every one of the multiple information storage MOS transistors M1 (M2), the pitch of word lines will not be matched with the arrangement of a plurality of the information storage MOS transistors M1 (M2). Where the minimum wiring pitch is set to a value smaller than the wavelength of light, phase shift techniques are used in mask pattern generation. In this case, providing patterns with regularity helps uniformize the pattern form. In consideration of this, if the pitch of the layout of the gate electrodes of information storage MOS transistors M1 and M2 is irregular, it is difficult to uniformize their pattern form. As a result, the miniaturization of devices, that is, the miniaturization of patterns, is hindered. With the constitution using the dummy MOS transistor M3, the polysilicon layer LG which constitutes the gate electrodes of the MOS transistors M1 (M2) for information storage and the gate electrodes Gm3 of the dummy MOS transistors M3 can be regularly laid out. Therefore, the above means helps uniformize their pattern form.

Figure 12:
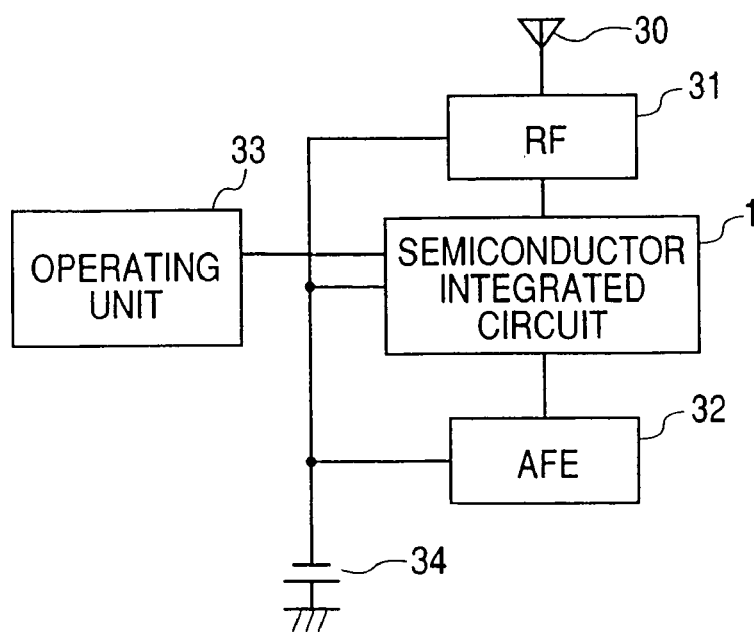
FIG. 12 is a block diagram illustrating a data processing system to which the semiconductor integrated circuit according to the present invention is applied.

FIG. 12 is a block diagram illustrating an example of a data processing system to which the semiconductor integrated circuit according to the present invention is applied. The data processing system illustrated in the figure is constituted as a mobile communication system, such as a cellular phone, though its constitution is not limited to this. The mobile communication system comprises: an antenna 30; a radio frequency unit (RF) 31; an analog front end unit (AFE) 32; an operating unit 33; and the semiconductor integrated circuit 1. In this example, the semiconductor integrated circuit 1 performs the following processing: protocol control for mobile communication, encoding and decoding of transmit data and receive data, error correction, control of the interface between the analog front end unit 32 and the operating unit 33, and the like. The mobile communication system uses a battery power supply 34 as an operating power supply; therefore, it is pressingly required that its power consumption should be reduced. In the semiconductor integrated circuit 1, as mentioned above, the on-chip ROM 4 also operates on the same low-voltage power supply as the logic circuit, such as the CPU 2, does. At this time, useless power consumption due to subthreshold leakage, which is made obvious in the ROM 4 by the low-voltage power supply, is reduced. Therefore, the major part of power available to the entire semiconductor integrated circuit 1 can be allocated to the logic circuit, such as the CPU 2. From the viewpoint of the amount of power which can be consumed at the logic circuit, such as the CPU 2, the processing power of the logic circuit, such as the CPU, can be enhanced. Therefore, the demand for the reduction of power consumption can be met, and, further, a high data processing power can be attained.

Figure 13:
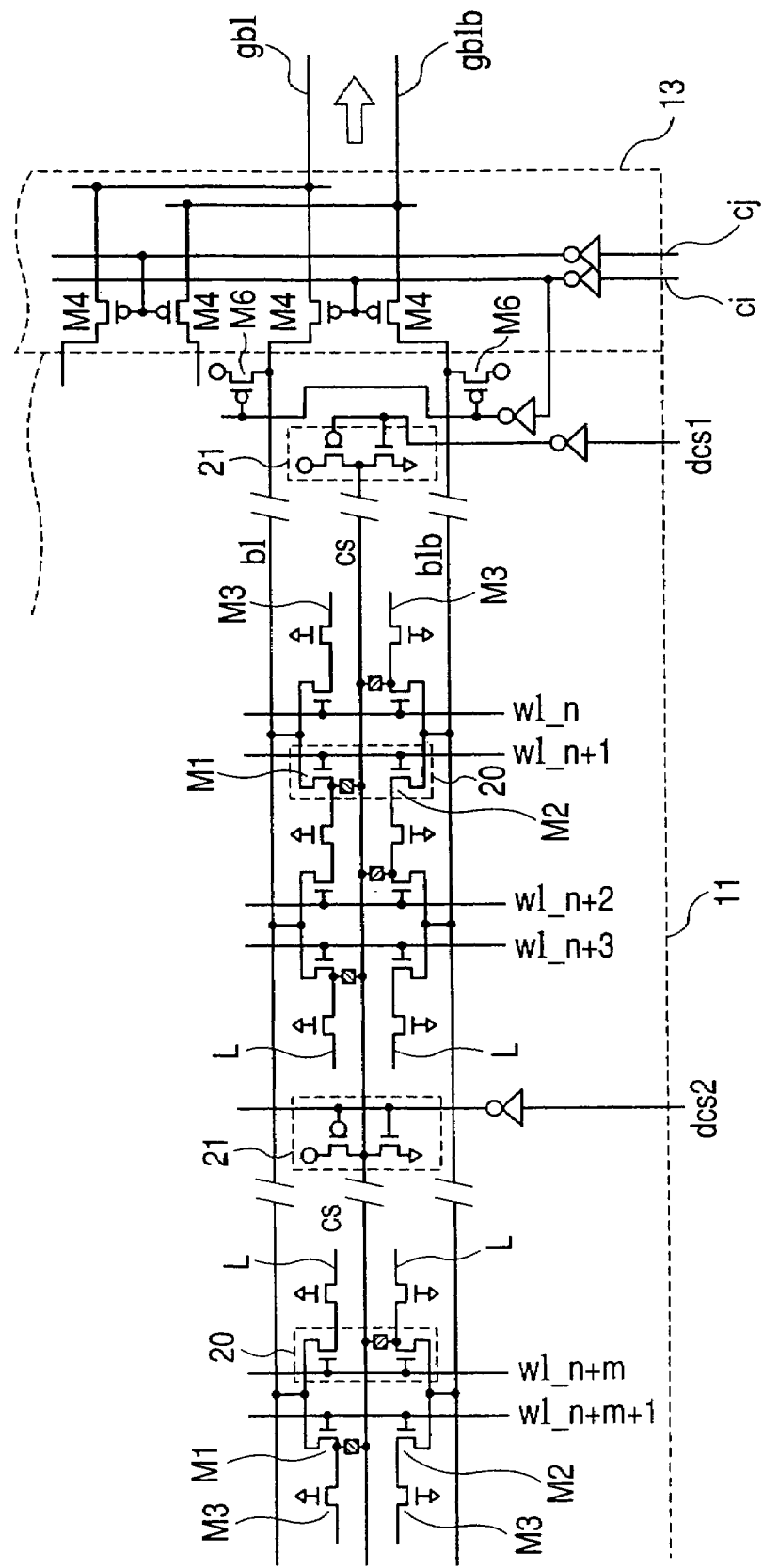
FIG. 13 is a schematic circuit diagram illustrating a substantial part of another example of a ROM in the semiconductor integrated circuit according to the present invention.

FIG. 13 illustrates another example of the ROM. One of the differences between it and FIG. 1 is that the common source line cs is divided in a memory mat. A CMOS inverter driver 21 is provided for each common source line cs, and these CMOS inverter drivers 21 are individually driven and controlled. The driving timing for precharge and discharge is the same as the case illustrated in FIG. 1. The common source line cs corresponding to the memory cell of a word line selected by a row address signal is caused to perform a discharge operation. For this purpose, the result of decoding the several higher-order bits of the row address signal is used to control the operation of a plurality of the CMOS inverter drivers 21. As control signals for that, signals dcs1 and dcs2 are representatively shown in the figure. With this constitution, the following advantage is brought about: when an attempt is made to increase one memory mat for the enhancement of speed, packing density, and capacity, the read operation can be further accelerated. When a mat is finely divided, the number of stages in a column select operation for each divided mat is increased. This leads to a result which is adverse to speedup.

Up to this point, the invention made by the present inventors has been specifically described based on various embodiments. However, the present invention is not limited to these embodiments, but it can be modified in various manners to an extent not departing from the concept of the invention.

Some examples will be taken. If a differential amplifier is not used, the bit lines need not be in a complementary configuration, and the memory cell may be constituted of one memory cell transistor. In the above description, the bit lines are brought to the level of the supply voltage, and the common source lines are brought to the ground voltage level when a read operation is performed. Alternatively, the following constitution may be adopted: on standby, the bit lines and the common source lines are brought to the ground voltage level, and, in a read operation, the bit lines are charged to the level of the supply voltage.

The logic circuit is not limited to a circuit module typified by a CPU, as described with reference to FIG. 2, but it may be modified as appropriate.

As mentioned above, the control circuit operates as follows: during the predetermined period Tacs in the operation of accessing a memory cell 20, it produces a potential difference between the source/drain electrodes of the MOS transistors M1 and M2. During the other periods Tstb than the predetermined period, the control circuit reduces the potential difference between the source/drain electrodes of the MOS transistors M1 and M2 to zero. The control circuit comprises the charge/discharge driver 21; an inverter 25 serving as a delay element; a column decoder 14, which generates column selection signals, such as ci and cj; and a timing controller 16, which determines the timing of column address decode operation by the column decoder 14. The present invention is not limited to this constitution, and it may be constituted as follows: the timing controller 16 generates timing signals for directly discharging the common source lines with the timing of word line selection taken into account. Then, the timing of discharging by the charge/discharge driver 21 is determined by a signal of the logical product of the above signals and the column selection signals.

The present invention is applicable to a wide range of semiconductor integrated circuits, for example, microcomputers and system LSIs, having a nonvolatile memory.

What is claimed is:

1. A semiconductor integrated circuit having over one semiconductor substrate a nonvolatile memory and a logic circuit which uses information stored in said nonvolatile memory to perform logical operation,
    wherein said nonvolatile memory and logic circuit use common supply voltage as their operating power supply voltage,
    wherein said nonvolatile memory comprises memory cells, word lines, complementary bit lines, and differential amplifiers connected with said complementary bit lines,
    wherein said memory cell comprises a pair of MOS transistors whose gate electrodes are connected with the same word line, the source/drain electrodes of one MOS transistor are connected with a bit line and a voltage signal line supplied with predetermined voltage, and the source/drain electrodes of the other MOS transistor are floated with respect to a bit line or said voltage signal line, and
    wherein said MOS transistors respectively included in a plurality of memory cells disposed along said bit lines are formed in a common well, and the MOS transistors are electrically separated from each other by a dummy MOS transistor whose gate electrode is supplied with off potential.

2. A semiconductor integrated circuit having over one semiconductor substrate a nonvolatile memory and a logic circuit which uses information stored in said nonvolatile memory to perform logical operation,
    wherein said nonvolatile memory and logic circuit use common supply voltage as their operating power supply voltage,
    wherein said nonvolatile memory comprises bit lines, word lines, and memory cells,
    wherein said memory cell comprises a MOS transistor whose gate electrode is connected with a word line, and information storage is carried out according to whether one source/drain electrode of said MOS transistor is connected with a current path or floated,
    wherein whether a MOS transistor is connected with said current path or floated is determined according to whether the one source/drain electrode thereof on the opposite side to the bit line is connected with a predetermined signal line or not, and
    wherein the MOS transistors respectively included in a plurality of memory cells disposed along said bit lines are formed in a common well, and are electrically separated from each other by a dummy MOS transistor whose gate electrode is supplied with off potential.

3. A semiconductor integrated circuit having a nonvolatile memory,
    wherein said nonvolatile memory comprises complementary bit lines, word lines, memory cells connected with said complementary bit lines and said word lines, and differential amplifiers connected with said complementary bit lines,
    wherein said memory cell comprises a first MOS transistor having one source/drain electrode connected with one bit line of said complementary bit lines and a gate electrode connected with said word line, and a second MOS transistor having one source/drain electrode connected with the other bit line of said complementary bit lines and a gate electrode connected with said word line,
    wherein in each memory cell, the other source/drain electrode of either said first MOS transistor or second MOS transistor is connected with a voltage signal line supplied with predetermined voltage, and
    wherein a third transistor is formed between the other source/drain electrodes of the first MOS transistors which adjoin to each other and share a bit line between them, and the third transistor is controlled to off state.

4. A semiconductor integrated circuit having a nonvolatile memory,
    wherein said nonvolatile memory comprises complementary bit lines, first word lines, second word lines, first memory cells connected with said complementary bit lines and said first word lines, second memory cells connected with said complementary bit lines and said second word lines, and differential amplifiers connected with said complementary bit lines,
    wherein said first memory cell comprises a first MOS transistor having a source-drain path connected between a voltage signal line supplied with predetermined voltage and one bit line of said complementary bit lines, and a gate electrode connected with said first word line, and a second MOS transistor having source/drain electrodes any one of which is floated and a gate electrode connected with said first word line,
    wherein said second memory cell comprises a third MOS transistor having a source-drain path connected between said voltage signal line and said one bit line of said complementary bit lines, and a gate electrode connected with said second word line, and a fourth MOS transistor having source/drain electrodes any one of which is floated and a gate electrode connected with said second word line,
    wherein a fifth transistor is provided which has source/drain electrodes connected with one of the source/drain electrodes of said first MOS transistor and one of the source/drain electrodes of said third MOS transistor, and is controlled to off state, and
    wherein a sixth transistor is provided which has source/drain electrodes connected with one of the source/drain electrodes of said second MOS transistor and one of the source/drain electrodes of said fourth MOS transistor, and is controlled to off state.

5. The semiconductor integrated circuit according to claim 4, wherein the other of said source/drain electrodes of said second MOS transistor is connected with the other of said complementary bit lines, and wherein the other of said source/drain electrodes of said fourth MOS transistor is connected with the other of said complementary bit lines.

6. The semiconductor integrated circuit according to claim 5, wherein during the other periods than a predetermined period in the operation of accessing said nonvolatile memory, voltage which substantially makes zero the potential difference between the source/drain electrodes of said first and third MOS transistors is applied to said voltage signal line.

7. The semiconductor integrated circuit according to claim 5, wherein a circuit is provided which substantially makes zero the potential difference between the source/drain electrodes of said first MOS transistor and the potential difference between the source/drain electrodes of said third MOS transistor during a first period in the operation of accessing said nonvolatile memory, and produces a predetermined potential difference between the source/drain electrodes of said first MOS transistor and between the source/drain electrodes of said third MOS transistor during a second period in the operation of accessing said nonvolatile memory.

8. The semiconductor integrated circuit according to claim 4, wherein a circuit is provided which substantially makes zero the potential difference between the source/drain electrodes of said first MOS transistor and the potential difference between the source/drain electrodes of said third MOS transistor during a first period in the operation of accessing said nonvolatile memory, and produces a potential difference between the source/drain electrodes of said first MOS transistor and between the source/drain electrodes of said third MOS transistor during a second period in the operation of accessing said nonvolatile memory.

9. A semiconductor integrated circuit having a nonvolatile memory, wherein said nonvolatile memory comprises bit lines, first word lines, second word lines, first memory cells connected with said bit lines and said first word lines, second memory cells connected with said bit lines and said second word lines, and amplifiers connected with said bit lines, wherein said first memory cell comprises a first MOS transistor having source/drain electrodes connected with a voltage signal line supplied with predetermined voltage and said bit line, and a gate electrode connected with said first word line, wherein said second memory cell comprises a second MOS transistor having source/drain electrodes one of which is floated and the other of which is connected with said bit line, and a gate electrode connected with said second word line, wherein a circuit is provided which substantially makes zero the potential difference between the source/drain electrodes of said first MOS transistor during a first period in the operation of accessing said nonvolatile memory, and produces a predetermined potential difference between the source/drain electrodes of said first MOS transistor during a second period in the operation of accessing said nonvolatile memory, and wherein a third transistor is provided which has source/drain electrodes connected with one the source/drain electrodes of said first MOS transistor and one of the source/drain electrodes of said second MOS transistor, and is controlled to off state.

10. A semiconductor integrated circuit having a nonvolatile memory, wherein said nonvolatile memory comprises bit lines, first word lines, second word lines, first memory cells connected with said bit lines and said first word lines, second memory cells connected with said bit lines and said second word lines, and amplifiers connected with said bit lines, wherein said first memory cell comprises a first MOS transistor having source/drain electrodes connected with a voltage signal line supplied with predetermined voltage and said bit line, and a gate electrode connected with said first word line, said second memory cell comprises a second MOS transistor having source/drain electrodes one of which is floated and the other of which is connected with said bit line, and a gate electrode connected with said second word line, and wherein a third transistor is provided which has source/drain electrodes connected with one of the source/drain electrodes of said first MOS transistor and the other of the source/drain electrodes of said second MOS transistor, and is controlled to off state.

* * * * *